United States Patent
Vishnyakov et al.

(10) Patent No.: US 9,399,733 B2
(45) Date of Patent: Jul. 26, 2016

(54) LUMINESCENT MATERIAL FOR SOLID-STATE SOURCES OF WHITE LIGHT

(76) Inventors: Anatoly Vasilyevich Vishnyakov, Moscow (RU); Yaohui Chang, Dalian (CN); Ekaterina Analtolyevna Vishniakova, Moscow (RU)

( * ) Notice: Subject to any disclaimer, the term of this patent is extended or adjusted under 35 U.S.C. 154(b) by 285 days.

(21) Appl. No.: 13/820,632

(22) PCT Filed: Oct. 22, 2010

(86) PCT No.: PCT/RU2010/000619
§ 371 (c)(1),
(2), (4) Date: Mar. 4, 2013

(87) PCT Pub. No.: WO2012/053924
PCT Pub. Date: Apr. 26, 2012

(65) Prior Publication Data
US 2013/0153825 A1 Jun. 20, 2013

(51) Int. Cl.
*C09K 11/77* (2006.01)
*H01L 33/50* (2010.01)

(52) U.S. Cl.
CPC ........... *C09K 11/7774* (2013.01); *H01L 33/502* (2013.01); *Y02B 20/181* (2013.01)

(58) Field of Classification Search
CPC ........... C09K 11/0883; C09K 11/7734; C09K 11/7721; C09K 11/7792; C09K 11/7769; C09K 11/7749; C09K 11/7774; Y02B 20/181; H01L 33/502
USPC .............................. 252/301.4 R; 313/486, 503
See application file for complete search history.

(56) References Cited

U.S. PATENT DOCUMENTS

| | | |
|---|---|---|
| 3,564,322 A | 2/1971 | Blasse |
| 5,998,925 A | 12/1999 | Shimizu et al. |
| 6,069,440 A | 5/2000 | Shimizu et al. |
| 6,596,195 B2 | 7/2003 | Srivastava et al. |
| 6,608,332 B2 | 8/2003 | Shimizu et al. |
| 6,630,077 B2 * | 10/2003 | Shiang et al. .......... 252/301.4 R |
| 6,793,848 B2 | 9/2004 | Vartuli et al. |
| 6,812,500 B2 | 11/2004 | Reeh et al. |
| 6,936,857 B2 | 8/2005 | Doxsee et al. |
| 7,008,558 B2 | 3/2006 | Vartuli et al. |
| 7,038,370 B2 | 5/2006 | Mueller-Mach et al. |
| 7,094,362 B2 * | 8/2006 | Setlur ................ C09K 11/7774 252/301.4 F |
| 7,135,129 B2 | 11/2006 | Naum et al. |
| 7,362,048 B2 | 4/2008 | Shimizu et al. |
| 7,573,189 B2 | 8/2009 | Juestel et al. |
| 8,128,840 B2 * | 3/2012 | Song ................... C09K 11/595 252/301.4 R |
| 2005/0088077 A1* | 4/2005 | Naum et al. .................. 313/503 |
| 2005/0093442 A1* | 5/2005 | Setlur ................ C09K 11/7774 313/512 |
| 2009/0179212 A1 | 7/2009 | Naum et al. |
| 2009/0195142 A1* | 8/2009 | Song ................... C09K 11/595 313/483 |
| 2009/0289226 A1* | 11/2009 | Naum et al. ............. 252/301.36 |

FOREIGN PATENT DOCUMENTS

CN 1927996 3/2007

OTHER PUBLICATIONS

English Abstract of CN 1927996.
N. P. Soschin et al., "Warm White Light-Emitting Diodes Based on p-n-Heterostructures InGaN/AlGaN/GaN Coated by Yttrium—Gadolinium Garnet Phosphors," Physics and Technology, 2009, vol .43, No. 5, pp. 700-704.
G. Blasse et al., "Luminescent Materials," 1994, Springer-Verlag, Germany.
C. Ronda, "Luminescence From Theory to Applications," 2008, Wiley-VCH, Germany.

* cited by examiner

Primary Examiner — Matthew E Hoban
Assistant Examiner — Lynne Edmondson
(74) Attorney, Agent, or Firm — Preston Smirman; Smirman IP Law, PLLC

(57) ABSTRACT

A luminescent material, containing yttrium oxide, oxides of rare-earth metals, as well as aluminum, gallium and indium oxides in a ratio that produces compounds corresponding to the general formula: $[(Y_{1-x-y-z}Ce_x(Ln-1)_y(Ln-2)_z]_{3-\alpha}(Al_{1-p-q}Ga_pIn_q)_5O_{12-1.5\alpha}$, where $\alpha$ is a value varying within the $0.20 \leq \alpha \leq 2.80$ range; x is cerium atomic fraction, in the range of $0.001 < x < 0.15$; $(Ln-1)_y$ is one or several lanthanides of the Gd, Tb, La, Lu and Sm, which, together with yttrium and cerium, form the basis of the "cation" sub-lattice, and $0 \leq y \leq 0.90$. $(Ln-2)_z$ is one or several lanthanides of the Pr, Nd, Eu, Dy, Ho, Tm, Er and Yb group. They are dopants introduced into the "cation" sub-lattice at a rate of $0.0001 < z < 0.01$; also x, y and z were selected in such a fashion that $1-x-y-z > 0$; p and q are atomic fractions of Ga and In in the aluminum sub-lattice. Their ranges are: $0 < p < 0.3$ and $0 < q < 0.3$.

6 Claims, 1 Drawing Sheet

A Luminescent Material for Solid Sources of White Light
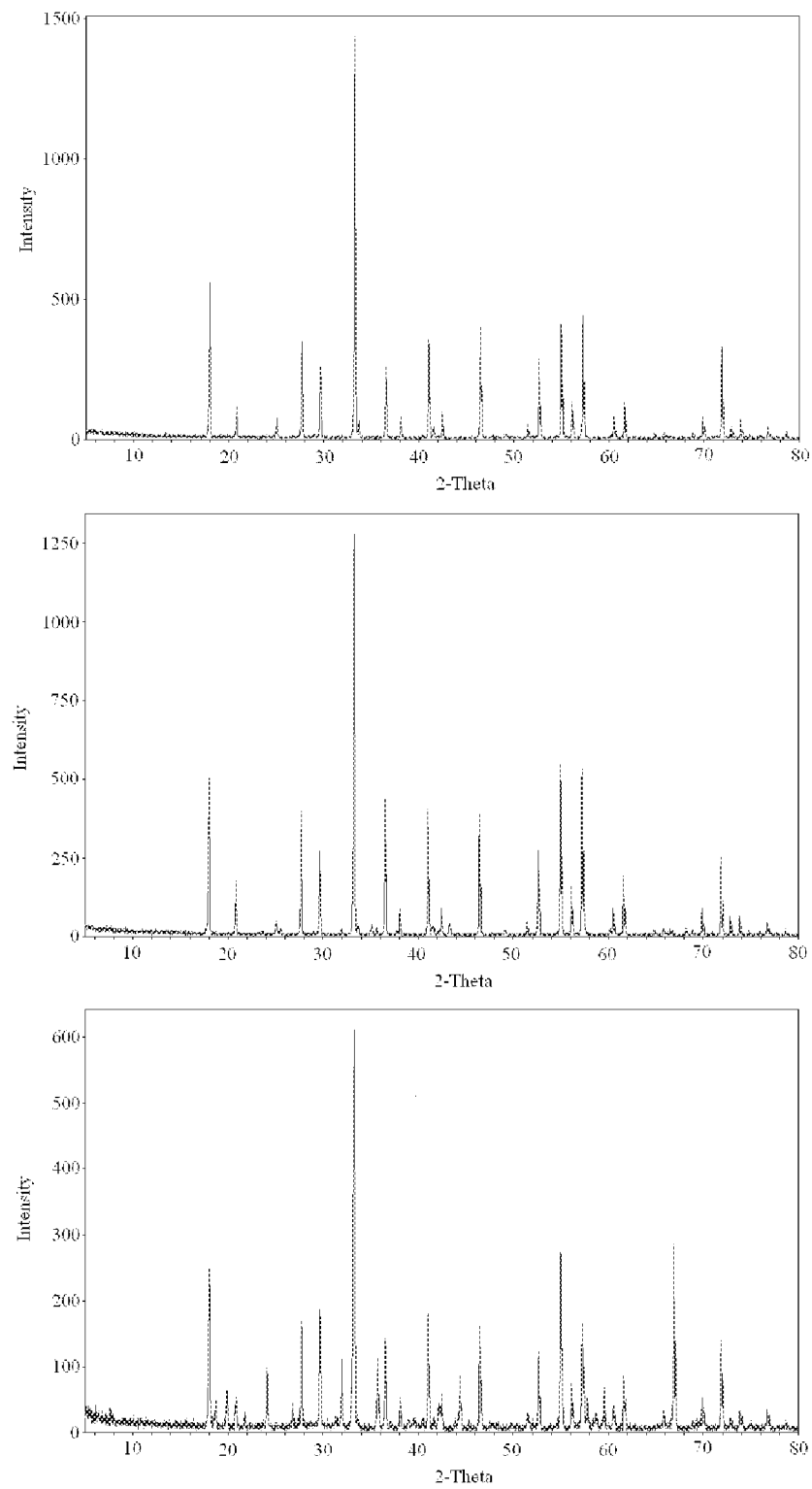

LUMINESCENT MATERIAL FOR SOLID-STATE SOURCES OF WHITE LIGHT

CROSS-REFERENCE TO RELATED APPLICATION

The instant application is a national phase of, and claims priority to, PCT International Application No. PCT/RU2010/000619, filed on Oct. 22, 2010, pending, the entire specification of which is expressly incorporated herein by reference.

This invention relates to light engineering, in particular to luminescent materials, which radiate yellow-orange light and can be used in solid sources of white light. White light is produced in these light sources as a result of a combination yellow-orange luminescence of phosphor and primary blue light (440-480 nm), generated by an InGaN light diode.

In recent years, highly effective white light sources, of up to 150 lumen/Watts light efficiency were developed on the basis of the above-mentioned sources. Their light efficiency is 10 times greater than that of incandescent lamps and almost twice greater that the light efficiency of gas-discharge luminescent light sources. Further development of solid sources of white light is the main perspective in light engineering.

The effectiveness of sources of this kind depends on the composition of the phosphors used. Silicates, phosphates, oxides, aluminates, nitrides and oxide-nitrides phosphors or mixtures of the above can be used [C. Ronda Luminescence: From Theory to Application. Science. 2007, 260 pages] for LED white light sources. The most effective among them are aluminates luminescent materials with a garnet structure, including yttrium, gallium and rare earth metals' oxides, activated by cerium. These phosphors are usually identified as YAG:Ce. Their chemical composition corresponds to the formula $(Y+\Sigma Ln)_3(\Sigma Me^{3+})_5O_{12}$, where Ln=Ce alone or together with Gd or several lanthanide group elements; $Me^{3+}$ represents aluminium or, in combination with aluminium, one or several metals from Ga, In and Sc group elements. The relationship between $$\frac{(Y+\sum Ln)}{\sum Me^{3+}}$$

is fixed and equal to ⅗.

Alongside with the structure-forming elements, each of the rare earth elements (Ln) plays a different role in the formation of luminescent properties of Y—Al garnets:

Ce acts as a luminescence activator, i.e., an atom, the electronic transitions in which define the colour of luminescence, while the concentration of this element defines the brightness of luminescence (similar functions can be carried out by Pr or Yb);

Gd, Tb, La, Lu and Sm are responsible for shifting the luminescence spectrum maximum toward longer (Gd or Tb) or shorter (La, Lu or Sm) waves (Ga, In or Sc can also be used for this purpose); Nd, Eu, Dy, Er, Ho, and Tm play an auxiliary role, which has been mentioned in several patents, but with no quantitative description.

Optical parameters of yellow-orange phosphors for solid light sources, based on blue-emitting light diodes are usually characterised with the following values:

the luminescence spectrum maximum (520-590 nm);
width of the emission band on the half of height at the wave length, corresponding to the luminescence spectrum maximum;
colour temperature ($T_C$), usually changing within the 2,500-9,000 K range;
colour coordinates (x and y);
colour rendering index Ra or CRI;
brightness, usually measured in comparison with the standard sample (most often in comparison with the sample manufactured by "Nichia corporation".)

A broad-band phosphor with yellow-orange glow, based on Y—Al garnet, activated by Ce, $(Y,Ce)_3Al_5O_{12}$ and its manufacturing method were first patented in 1967 by G. Blasse and A. Brile (Philips) in several countries, including the USA: AS U.S. Pat. No. 3,564,322 (U.S. Class: 313/468; International Class: C09K11/77) of 29 Apr. 1967. A more sophisticated composition, $(Y,Gd,Ce)_3Al_5O_{12}$, which has similar luminescence properties, was described in the 1970s. References to that patent can be found in fundamental handbooks on luminescent materials [G. Blasse and B. C. Grabmaier, "Luminescent Materials", Springer-Verlag, Berlin (1994); S. Shionoya, Phosphor Handbook/Science (1998), 921 pages)].

30 years after G. Blasse, from 1998 to 2008, the Japanese company "Nichia" received several patents for a device consisting of a semiconductor heterotransition InGaN, emitting light of 450-470 nm and coated with YAG:Ce luminescent materials [U.S. Pat. No. 5,998,925 (U.S. Class: 313/503; Intern'l Class: H01J001/62) of 7 Dec. 1997, U.S. Pat. No. 6,069,440 (U.S. Class: 313/486,489; Intern'l Class: H01L 033/00) of 30 May 2000, U.S. Pat. No. 6,608,332 (U.S. Class: 257/98) of 19 Aug. 2003, U.S. Pat. No. 6,614,179 (U.S. Class: 353/512; Intern'l Class: H01L 33/00) of 19 Aug. 2003, U.S. Pat. No. 7,362,048 (U.S. Class: 313/512].

The authors of all the above patents dealt with the composition that corresponds to the following formula:

$$(Y_{1-x}\Sigma Ln_x)_3(Al_{1-a-b-c}Ga_aIn_b)_5O_{12},$$

where Y, Gd and Ce are the main rare-earth elements and alongside them are mentioned as well as Lu, Sm, La, and Sc.

"Osram" U.S. Pat. No. 6,812,500 (U.S. Class: 257/98; Intern'l Class: H01L33/00 of 2 Nov. 2004 suggests to use as photo-transforming luminescent materials a number of Ce-doped garnets, preferably YAG:$Ce^{3+}$ and also $Y_3Ga_5O_{12}$:$Ce^{3+}$, $Y(AlGa)_5O_{12}$:$Ce^{3+}$, $Y(AlGa)_5O_{12}$:$Tb^{3+}$, $YAlO_3$:$Ce^{3+}$, $YGaO_3$:$Ce^{3+}$, $Y(Al,Ga)O_3$:$Ce^{3+}$, as well as ortosilicates $M_2SiO_5$:$Ce^{3+}$ (M: Sc,Y) and, in particular, $M_2SiO_5$:$Ce^{3+}$. The patent also mentions that scandium or lanthanum can be used in these compounds instead of yttrium. However only YAG:$Ce^{3+}$ of all the above compositions is was included in the "Claims" part.

More recently, several approaches were patented, suggesting certain compositions with different sets of rare-earth elements, while maintaining the unified formula "$A_3$-$B_5$—$O_{12}$". For example Japanese Patent #P2001-195655 and American patents [U.S. Pat. No. 7,038,370 (May 2, 2006) and U.S. Pat. No. 7,573,189 (Aug. 11, 2009)]. The Japanese authors patented the following composition:

$$(Re_{1-x-y}Pr_xGe_y)_3(Al,Ga)_5O_{12},$$

where 0.0001<x<0<0.05, while Re=Y, Gd, Tb, Sc, La, Lu and 0.01<y<0.2.

The composition offered by the authors from Lumiled Lighting Corporation corresponds to the following formula:

$$(Lu_{1-x-y-a-b}Y_xGd_y)_3(Al_{1-z}Ga_z)_5O_{12}:Ce_a,Pr_b,$$

where 1-x-y-a-b>0; 0<z<0.5; 0<a<0.2 and 0<b<0.1.

Along with stoichiometric compositions, there appeared some patents claiming the possibility of producing phosphors with the ratio between (Y+ΣLn) and (ΣAl,Ga,In) being differed from the traditional 3:5, i.e., being higher or lower than this ratio.

From 2001 to 2003, the authors from "General Electric" obtained five patents for terbium, lutetium, and terbium-lutetium garnets: U.S. Pat. No. 6,598,195 (22 Jul. 2003), U.S. Pat. No. 6,630,077 (7 Oct. 2003), U.S. Pat. No. 6,793,848 (21 Sep. 2004), U.S. Pat. No. 6,936,857 (30 Aug. 2005), and U.S. Pat. No. 7,008,558 (7 Mar. 2006), the first of them being the base one. The possible indexes for the $(\Sigma Ln)_a$ to $(\Sigma Al,Ga,In)_z$ ratio were given as 2.8<a<3 and 4<z<5. However, not a single paragraph in CLAIMS quotes any compositions, in which the 2.8<a<3 condition, corresponding to the surplus of aluminium, was used. Every paragraph of CLAIMS in this patent mentions phosphors with the 'a' index being 3. On the other hand, every paragraph presents the value of z. In 9 out of 12 paragraphs, 4.6<z<5, in one case 4.5<z<5, and in two paragraphs, related to terbium and cerium in the lanthanide sub-lattice, 4<z<5. It is worth emphasising that the authors of this patent, having changed the indices of ΣLn and Al, i.e., in actual fact meaning a non-stoichiometric garnet composition, wrote down the oxygen index as 12. Taking into consideration that the charge state of every metal included in the composition of the phosphors mentioned in these patents corresponds to $Me^{3+}$, then maintaining the oxygen index at 12 is, for a single phase composition, is possible only when the charge of every lanthanide group element is greater than 3. The latter is impossible because phosphors are manufactured in reducing atmospheres (high temperature and in presence of hydrogen), when the stable state for terbium and cerium is 3+.

In the latest patent by "General Electric" (U.S. Pat. No. 7,008,558 (7 Mar. 2006) compound compositions are represented by the formula: $(G_{1-x-y}A_xRe_y)_aD_zO_{12}$, the variations of the stoichiometric indices a and z are presented by 2.8<a<3.1 and 4<z<5.1 (preferred ranges being 2.884<a<3.032 and 4.968<z<5.116).

In 2006, U.S. Pat. No. 7,135,129 (U.S. Class: 252/301.4R; Intern'l Class: C09K11/08 of 14 Nov. 2006 was issued for the following phosphor: $(Y_{1-x-y-z-q}Gd_xDy_yYb_zEr_qCe_p)_\alpha$ $(Al_{1-n-m-k}Ga_nSc_mIn_k)_\beta O_{12}$, where the stoichiometric indices α and β were: α=2.97-3.02 and β=4.98-5.02). As one can see, these indices differ from the traditional ones in the structure of stoichiometric Y—Al garnet: 3 and 5.

Thus, among all the patents related to phosphors based on the classical Y—Al garnet, the authors of the latter patent suggested for the first time to synthesise a compound of a non-stoichiometric composition, albeit defined in a very narrow range (±0.02). This patent can be regarded as the prototype of the invention claimed by the present authors.

The authors of the present invention aim at broadening the range of luminescent materials for solid sources of white light. As mentioned above, when looking for yellow-orange phosphors, attention used to centre first of all on producing $(Y+\Sigma Ln)_3Al_5O_{12}$ compositions with the ratio 3-5-12 between its elements or characterised by relatively small deviations from this ratio. On the other hand, it is known that oxides of aluminium and rare-earth elements can form several different compounds. In the $Y_2O_3$—$Al_2O_3$ system, in addition to $Y_3Al_5O_{12}$ several compounds have been established, the compositions of which change when the yttrium oxide content decreases (i.e., that of aluminium oxide increases), following this sequence: $Y_5Al_3O_{12} \rightarrow YAlO_3 \rightarrow Y_3Al_5O_{12} \rightarrow YAl_2O_{4.5} \rightarrow YAl_3O_6$ [The Joint Committee on Powder Diffraction Standards: JCPDS Data Base].

The same sequence can be presented in the following unified—with respect to Al content in form:

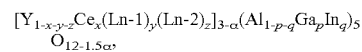

It is possible to synthesise a lot of Ce-doped compositions on the basis of these compounds, by substituting rare-earth elements for a part of yttrium, or, also, substituting Ga, In or Sc for Al: $(Y_{1-x}Ce_xLn)_{3\pm\alpha}(Al_{1-p-q}Ga_pIn_q)_5O_{12\pm1.5\alpha}$. One needs to remember that 1 luminescent systems are prone to forming compositions not only on the basis of (Y Ln)$_3$Al$_5$O$_{12}$. However, as far as the authors know, no one has yet studied any other systems experimentally or obtained patent documents concerning their practical application.

Taking this into account, the stated above aim can be achieved by manufacturing a luminescent material for solid sources of white light, based on blue-glowing InGaN light diodes, containing an yttrium oxide, oxides of rare-earth metals, as well as aluminium, gallium, and indium oxides. The composition of this luminescent material fits the general formula:

$$[Y_{1-x-y-z}Ce_x(Ln-1)_y(Ln-2)_z]_{3-\alpha}(Al_{1-p-q}Ga_pIn_q)_5O_{12-1.5\alpha},$$

where:
α is a value characterising decrease of the stoichiometric index in comparison with value 3 for the Y—Ga garnet and varying within the 0.20≤α≤2.80 range in such a fashion that the stoichiometric index of oxygen varies within the 11.70≥$O_{12-1.5\alpha}$≥7.80 range;
x is the atomic fraction of cerium which varies within the 0.001<x<0.15 range;
(Ln-1)$_z$ is one or several lanthanides from the Gd, Tb, La, Lu, Sm group, which—together with yttrium and cerium—form the basis of the "cation" sub-lattice, where 0<y<0.90;
(Ln-2)$_y$ is one or several lanthanides of the Pr, Nd, Eu, Dy, Ho, Tm, Er, Yb group; which are dopants introduced into the "cation" sub-lattice in concentrations: 0.0001<z<0.01;
x, y and z have been chosen in such a fashion that 1-x-y-z>0;
p and q are atomic fractions of Ga and In in the aluminium sub-lattice of the crystal; their ranges are 0<p<0.3 and 0<q<0.3.

The following materials fit the above formula:
a luminescent material, the stoichiometric index (3-α) of which in the general formula $[Y_{1-x-y-z}Ce_x(Ln-1)_y(Ln-2)_z]_{3-\alpha}(Al_{1-p-q}Ga_pIn_q)_5O_{12-1.5\alpha}$ varies in the 2.80≥(3-α)≥1.67 when the oxygen index varies within the 11.70≥$O_{12-1.5\alpha}$≥10.005 range simultaneously;
a luminescent material based on the following compound:

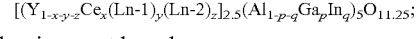

a luminescent based on:

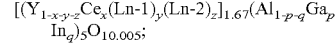

a luminescent material as in claim 1, the (3-α) index of which changes from 1.67 to 0.20, and which is a two-phase system: one phase has the composition:

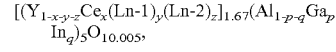

while the other phase is aluminium oxide.
In addition to these materials, luminescent materials containing yttrium oxide, oxides of rare-earth metals as well as aluminium oxide can be synthesised, with their compositions corresponding to the following general formula:

$$[Y_{1-x-y-z}Ce_x(Ln-1)_y(Ln-2)_z]_{3-\alpha}Al_5O_{12-1.5\alpha},$$

where:
- α is a value changing in the 0.20≤α≤2.80 range, i.e., so that the stoichiometric index of oxygen varies within the 11.7≥$O_{12-1.5\alpha}$≥7.80 range;
- x is the atomic fraction of cerium changing within the 0.001<x<0.15 range;
- $(Ln-1)_y$ represents one or several lanthanides of the Gd, Tb, La, Lu, Sm group, which—together with yttrium and cerium-constitute the basis of the "cation" sub-lattice, and 0<y<0.90;
- $(Ln-2)_z$ represents one or several lanthanides of the Pr, Nd, Eu, Dy, Ho, Tm, Er, Yb group, which are dopants introduced into the "cation" sub-lattice in concentrations 0.0001<z<0.01;
- x, y and z were selected in such a fashion that 1-x-y-z>0.

The following materials satisfy this formula:
a luminescent material with stoichiometric index (3-α) of which in the general formula $[Y_{1-x-y-z}Ce_x(Ln-1)_y(Ln-2)_z]_{3-\alpha}Al_5O_{12-1.5\alpha}$ varies in the 2.80≥(3-α)≥1.67 range, while the oxygen index changes in the 11.7≥$O_{12-1.5\alpha}$≤10.005 range.

a luminescent material based on the following composition:

$$[(Y_{1-x-y-z}Ce_x(Ln-1)_y(Ln-2)_z]_{2.50}Al_5O_{11.25}$$

a luminescent material based on the following composition:

$$[(Y_{1-x-y-z}Ce_x(Ln-1)_y(Ln-2)_z]_{1.67}Al_5O_{10.005},$$

luminescent material, (3-α) index of which changes from 1.67 to 0.2 and which is a two-phase system: one phase has the composition:

$$[(Y_{1-x-y-z}Ce_x(Ln-1)_y(Ln-2)_z]_{1.67}Al_5O_{10.005},$$

while the other phase is aluminium oxide.

Some of the listed above materials fit into the range of luminescent materials containing yttrium oxide, oxides of rare-earth metals as well as aluminium oxide, while the composition of the luminescent material fits:

$$[Y_{1-x-y}Ce_x(Ln-1)_y]_{3-\alpha}Al_5O_{12-1.5\alpha}$$

where
- α changes in the 0.20≤α≤2.80 range, i.e., so that the stoichiometric index of oxygen varies in the 11.70≥$O_{12-1.5\alpha}$≥7.80 range;
- x is the atomic fraction of cerium, which varies in the 0.001<x<0.15 range;
- $(Ln-1)_y$ is one or several lanthanides of the Gd, Tb, La, Lu, Sm group, which, together with yttrium and cerium, form the basis of the "cation" sub-lattice, and 0<y<0.90, while
- x and y were selected so that 1-x-y>0.

The following materials satisfy the formula:

$$[Y_{1-x-y}Ce_x(Ln-1)_y]_{3-\alpha}Al_5O_{12-1.5\alpha}$$

a luminescent material,
index α of which changes in, i.e., so that the stoichiometric index of oxygen varies in the 2.80≥(3-α)≥1.67 range, while the oxygen index varies in the 11.70≥$O_{12-1.5\alpha}$≥10.005 range simultaneously;
a luminescent material based on the following composition: $[(Y_{1-x-y}Ce_x(Ln-1)_y]_{2.50}Al_5O_{11.25}$;
a luminescent material based on the following composition: $[(Y_{1-x-y}Ce_x(Ln-1)_y]_{1.67}Al_5O_{10.005}$;

a luminescent material as in claim 11, (3-α) index of which changes from 1.67 to 0.2 and which is a of two-phases system: one phase has the composition:

$$[(Y_{1-x-y}Ce_x(Ln-1)_y]_{1.67}Al_5O_{10.005},$$

while the other phase is aluminium oxide.

PRACTICAL EXAMPLES

The composition of the manufactured luminophores fit the following formulas:

$$[(Y_{1-x-y-z}Ce_x(Ln-1)_y(Ln-2)_z]_{3-\alpha}(Al_{1-p-q}Ga_pIn_q)_5O_{12-1.5};$$

and/or $$[(Y_{1-x-y-z}Ce_x(Ln-1)_y(Ln-2)_z]_{3-\alpha}Al_5O_{12-1.5}.$$

More than 30 samples were prepared, different in their (3-α) index and in their composition with respect to the rare earth elements Y, Ce, Pr, Nd, Ga, Tb, Dy and of the aluminium-replacing elements.

To illustrate the pattern of variations of the optical properties, practical examples are presented below in the form of data for 11 samples with a permanent composition with respect to yttrium and rare-earth elements, $(Y_{0.78}Gd_{0.17}Ce_{0.05})_{3-\alpha}Al_5O_{12-1.5}$, while the (3-α) index varied from 3.0 to 0.3 from one experiment to the next one, which corresponded to the $$\frac{Al}{(Y_{1-x-y-z}Ce_x(Ln_1)_y(Ln_2)_z)}$$

ratio varying from 5/3 to 5/0.3.

The practical examples include the data for sample No. 12, the composition of which corresponded to the formula $(Tb_{0.80}Y_{0.10}Ce_{0.10})_{1.67}Al_5O_{10.005}$. Some compounds, containing cerium and gadolinium and doped with Pr, Nd, and Dy (examples 13-14) and some $[(Y_{0.78}Gd_{0.17}Ce_{0.5})_{1.67}Al_{5-p-q}Ga_pIn_qO_{10.005}]$ phosphors, in which some of aluminium was replaced with gallium and indium (examples 15-18) were also synthesised.

The phosphors included in the list of examples were prepared by thermal treatment of a mixture of yttrium and rare-earth metals' oxides and aluminium hydroxide. Particle size ($d_{50}$) of the raw materials was less than 3 microns (laser analyser of particle size).

The raw materials (yttrium and lanthanide oxides as well as aluminium hydroxide) were mixed dry in closed polyethylene containers, using a vibration bench or in mixers of other kinds, equipped with polyethylene-coated metal balls.

The mixtures were fired in the presence of fluxes, which promoted mass transfer due to the formation of a liquid phase on the surface of the solids involved in the reaction, and thus increased the formation rate of the target product. Mixtures of barium chloride and fluoride were used as fluxes, as well as strontium, aluminium or ammonium fluorides.

The heat treatment was carried out in corundum crucibles ($Al_2O_3$). The reacting materials were gradually heated in a reducing atmosphere ($N_2+H_2$) at a rate of 7-10 degrees/min up to 1430° C. The samples were held at that temperature for 3-5 hours, then the crucibles were cooled down to 200° C. in 5 hours. To remove the fluxes, the heat-treated samples were washed several times in large amounts of distilled water and dried at 150° C. in air.

The average size of particles of the phosphors prepared was 10-15 microns.

Example 1

Example 1 reproduces one of the compositions of the classical Y—Ga garnet, activated with Ce, when $$\frac{Al}{(Y_{1-x-y}Ce_xGd_y)} = \frac{5}{3}.$$

Synthesis of the $(Y_{0.78}Gd_{0.17}Ce_{0.05})_{3.00}Al_5O_{12}$ sample was carried out, using $Y_2O_3$, $Gd_2O_3$, $CeO_2$ and $Al(OH)_3$ as raw materials. Firing temperature was 1430° C. The duration of treatment at high temperature was 3.5 hours.

Example 2

The composition of the sample was $(Y_{0.78}Gd_{0.17}Ce_{0.05})_{2.90}Al_5O_{11.85}$; heat treatment conditions and raw materials were as in Example 1.

Example 3

An $(Y_{0.78}Gd_{0.17}Ce_{0.05})_{2.80}Al_5O_{11.7}$ sample was used; raw materials and heat treatment were the same as in Example 1.

Example 4

An $(Y_{0.78}Gd_{0.17}Ce_{0.05})_{2.70}Al_5O_{11.55}$ sample was used; raw materials and heat treatment conditions were the same as in Example 1.

Example 5

An $(Y_{0.78}Gd_{0.17}Ce_{0.05})_{2.50}Al_5O_{11.25}$ sample used; raw materials and heat treatment were the same as in Example 1.

Example 6

An $(Y_{0.78}Gd_{0.17}Ce_{0.05})_{2.30}Al_5O_{10.95}$ sample used; raw materials and heat treatment were the same as in Example 1.

Example 7

An $(Y_{0.78}Gd_{0.17}Ce_{0.05})_{1.67}Al_5O_{10.005}$ sample used; raw materials and heat treatment were the same as in Example 1.

Example 8

An $(Y_{0.78}Gd_{0.17}Ce_{0.05})_{1.50}Al_5O_{9.75}$ sample used; raw materials and heat treatment were the same as in Example 1.

Example 9

An $(Y_{0.78}Gd_{0.17}Ce_{0.05})_{1.00}Al_5O_{9.00}$ sample used; raw materials and heat treatment were the same as in Example 1. The obtained sample contained two phases: it contained $Al_2O_3$ inclusions.

Example 10

An $(Y_{0.78}Gd_{0.17}Ce_{0.05})_{0.50}Al_5O_{8.25}$ sample used; raw materials and heat treatment were the same as in Example 1. The obtained sample contained two phases: it contained $Al_2O_3$ inclusions.

Example 11

An $(Y_{0.78}Gd_{0.17}Ce_{0.05})_{0.30}Al_5O_{8.95}$ sample used; raw materials and heat treatment were the same as in Example 1. The obtained sample contained two phases: it contained $Al_2O_3$ inclusions.

Example 12

Synthesis of the terbium-yttrium-cerium composition $(Tb_{0.80}Y_{0.10}Ce_{0.10})_{1.67}Al_5O_{10.005}$ was carried out using raw materials consisted of $Tb_4O_7$, $Y_2O_3$, $CeO_2$ and $Al(OH)_3$. Firing temperature was 1430° C. Time of exposure was 3.5 hours.

Example 13

Synthesis of the $(Y_{0.78}Gd_{0.168}Pr_{0.002}Ce_{0.05})_{1.67}Al_5O_{10.005}$ sample was carried out, using $Y_2O_3$, $Gd_2O_3$, $Pr_6O_{11}$, $CeO_2$ and $Al(OH)_3$. Heat treatment temperature was 1430° C. Time of exposure was 3.5 hours.

Example 14

Synthesis of $(Y_{0.78}Gd_{0.168}Nd_{0.001}Dy_{0.001}Ce_{0.05})_{1.67}Al_5O_{10.005}$ was carried out, using $Y_2O_3$, $Gd_2O_3$, $Nd_2O_3$, $CeO_2$ and $Al(OH)_3$. Heat treatment temperature was 1430° C. Time of exposure was 3.5 hours.

Example 15

Synthesis of $(Y_{0.78}Gd_{0.17}Ce_{0.05})_{1.67}Al_{4.9}Ga_{0.1}O_{10.005}$ was carried out from raw materials consisting of $Y_2O_3$, $Gd_2O_3$, $Ga_2O_3$, $CeO_2$ and $Al(OH)_3$. Heat treatment temperature was 1430° C. Time of exposure was 3.5 hours.

Example 16

Synthesis of $(Y_{0.78}Gd_{0.17}Ce_{0.05})_{1.67}Al_{4.8}Ga_{0.2}O_{10.005}$ was carried out from the same raw materials and in the same conditions as in Example 15.

Example 17

Synthesis of $(Y_{0.78}Gd_{0.17}Ce_{0.05})_{1.67}Al_{4.71}Ga_{0.29}O_{10.005}$ was carried out from the same raw materials and in the same conditions as in Example 15.

Example 18

Synthesis of $(Y_{0.78}Gd_{0.17}Ce_{0.05})_{1.67}Al_{4.75}Ga_{0.15}In_{0.10}O_{10.005}$ was carried out from raw materials made of $Y_2O_3$, $Gd_2O_3$, $Ga_2O_3$, $In_2O_3$, $CeO_2$ and $Al(OH)_3$. Heat treatment temperature was 1430° C. Time of exposure was 3.5 hours.

Light engineering parameters of the synthesised luminophores were measured, using a certified (EVERFINE) HAAS-2000 device. Measurements were carried out in the 380-780 nm wavelength range. Yellow-orange luminescence and the blue emission of the light diode (455 nm), reflected at 45° from the sample of luminescent material, were registered together. The following parameters were registered in these measurements:

1) Total brightness (I) in arbitrary units;
2) Position of the dominant wavelength ($\lambda_{dom.}$, nm), the peak of the yellow-orange emission spectrum ($\lambda_{peak}$, nm), as well as the width of the spectrum at half peak ($\Delta\lambda$, nm). These parameters varied over rather narrow ranges: $\lambda_{dom}$=575-578 nm; $\lambda_{peak}$=565-569 nm and $\Delta\lambda$=120-124 nm;

3) Colour coordinates x and y.
4) Colour temperature ($T_C$,K).

The results of these measurements are presented in Table 1. The data related to the composition with an assigned oxygen index, specified in two lines, correspond to the simultaneously synthesised samples of the same composition. Comparison of the optical parameters of the sample with the stoichiometric composition (3:5) of an yttrium-gadolinium garnet, activated with cerium (Example 1) with the respective parameters of the available to us commercial samples of "Nichia corporation" showed that our samples were not inferior in total brightness to the commercial samples and were on the same level with them in colour coordinates and colour temperature.

TABLE 1

Optical Parameters of the Phosphors Prepared

| Example Nos. | (3-α) Index | I, arb · un | $\lambda_{dom.,}$ nm | Colour Coordinates X | y | $T_C$, K |
|---|---|---|---|---|---|---|
| 1 | 3.0 | 306 | 576.5 | 0.448 | 0.463 | 3252 |
| Prototype | 3.0 | 299 | 577.2 | 0.437 | 0.448 | 3336 |
| 2 | 2.9 | 304 | 575.4 | 0.440 | 0.456 | 3328 |
|  | 2.9 | 306 | 576.8 | 0.446 | 0458 | 3251 |
| 3 | 2.8 | 305 | 576.4 | 0.446 | 0.461 | 3278 |
| 4 | 2.7 | 301 | 577.2 | 0.432 | 0.441 | 3365 |
| 5 | 2.5 | 306 | 578.1 | 0.435 | 0.4480 | 3354 |
| 6 | 2.3 | 284 | 576.8 | 0.435 | 0.446 | 3350 |
| 7 | 1.67 | 294 | 576.8 | 0.412 | 0.421 | 3581 |
| 8 | 1.50 | 306 | 576.1 | 0.422 | 0.4374 | 3517 |
|  | 1.50 | 297 | 576.8 | 0.412 | 0.420 | 3583 |
| 9 | 1.0 | 297 | 575.5 | 0.416 | 0.423 | 3532 |
| 10 | 0.5 | 284 | 573.7 | 0.341 | 0.331 | 5125 |
| 11 | 0.3 | 260 | 572 | 0.292 | 0.265 | 10043 |
|  | 0.3 | 264 | 573 | 0.287 | 0.259 | 11393 |
| 12 | 1.67 | 243 | 576.8 | 0.413 | 0.421 | 3576 |
|  | 1.67 | 263 | 576.3 | 0.420 | 0.418 | 3417 |
| 13 | 1.67 | 269 | 578.0 | 0.416 | 0.417 | 3473 |
|  | 1.67 | 272 | 578.3 | 0.406 | 0.404 | 3597 |
| 14 | 1.67 | 252 | 576.6 | 0.393 | 0.401 | 3852 |
| 15 | 1.67 | 291 | 576.3 | 0.403 | 0.414 | 3720 |
| 16 | 1.67 | 291 | 577.3 | 0.391 | 0.3954 | 3857 |
| 17 | 1.67 | 290 | 578.4 | 0.394 | 0.393 | 3756 |
| 18 | 1.67 | 272 | 577.1 | 0.395 | 0.400 | 3804 |

An overview of the experimental results showed no significant changes in the optical properties of specimens in the 3 to 2.5 index range except for a weak tendency toward both colour coordinates decrease and, consequently, toward colour temperature increase. X-ray analysis showed that the crystalline structure of these compounds was no different from the garnet structure (FIG. 1, top). Not withstanding the introduction of a considerable surplus of aluminium oxide with respect to the (Y+ΣLn) sum, the samples contained no inclusions of the $Al_2O_3$ phase. It is worth noticing here that studies of physical mixtures of $Al_2O_3$ with $(Y_{0.78}Gd_{0.17}Ce_{0.05})_{3.00}Al_5O_{12}$ (FIG. 1, middle) showed that the presence of corundum was registered with certainty when its content was 10 molar %, using the 5 most intensive reflections on 2-Theta° angles=25.58, 35.16, 43.37, 66.51, 68.19 and 68.49.

Thus, $(Y_{0.78}Gd_{0.17}Ce_{0.05})_{3-\alpha}Al_5O_{12}$ compositions with indices from 3.00 to 2.5 behaved as if an unlimited series of solid solutions formed in the $(Y+Ln)_3Al_5O_{12}$-$(Y+Ln)_{2.5}Al_5O_{11.25}$ system.

In the 2.5-1.67 index range, i.e., as the molar surplus of aluminium oxide tended toward its twofold value with respect to the $(Y+\Sigma Ln)_3Al_5O_{12}$ phase, colour coordinates decreased slightly, while colour temperature increased. In this range of compositions too X-ray analysis detected no reflections belonging to the $Al_2O_3$ phase, however a system of new diffraction peaks was registered. Their intensity increased gradually, reaching its highest value in the samples with the composition corresponding to index 1.67.

FIG. 1 (bottom) shows the X-ray pattern of $(Y_{0.78}Gd_{0.17}Ce_{0.05})_{1.67}Al_5O_{10.005}$. It is clear that the set of diffraction reflections in this case includes a significant number of lines in comparison with $(Y_{0.78}Gd_{0.17}Ce_{0.05})_3Al_5O_{12}$ (FIG. 1, top). However structural changes were not accompanied by any significant changes in optical properties of the phosphors.

At last in the range of indices from 1.67 to 0.3, a two-phase system formed, and changes in the composition resulted in the reduced intensity of the lines of the $(Y_{0.78}Gd_{0.17}Ce_{0.05})_{1.67}Al_5O_{10.005}$ phase and in increased intensity of the reflections related to aluminium oxide.

The appearance of aluminium oxide as the second phase had little effect on the total brightness of the glow, even when (3-α) was ≤0.5. However, the colour coordinates started to decrease considerably, while colour temperature- to rise sharply. It is worth a note that these samples, unlike those with indices from 3 to 1.50, were characterised by considerably lower stability of their properties with respect to fragmentation.

It is important to note that, according to these authors' measurements, the density curve of crystalline phases in the $(Y+\Sigma Ln)_3Al_5O_{12}$—$Al_2O_3$ system deviates considerably from the additive straight line connecting the density of pure components. This fact points directly that aluminium oxide becoming incorporated into the structure of the $(Y_{0.78}Gd_{0.17}Ce_{0.05})_{3-\alpha}Al_5O_{12-1.5\alpha}$ phase.

Picnometric density of the samples prepared by the authors decreased steadily in this range from 4.75 g/cm³ for $(Y_{0.78}Gd_{0.17}Ce_{0.05})_3Al_5O_{12.00}$ to 4.40 g/cm³ for $(Y_{0.78}Gd_{0.17}Ce_{0.05})_{1.67}Al_5O_{10.00}$, while the additive value for that sample would be 4.18 g/cm³. After the $(Y_{0.78}Gd_{0.17}Ce_{0.05})_{1.0}Al_5O_{9.00}$ composition, density dropped quickly from 4.35 g/cm³ to 3.95 g/cm³ for the sample with index 0.5. In the $(Y_{0.78}Gd_{0.17}Ce_{0.05})_3Al_5O_{12.00}$—$Al_2O_3$ system, the $(Y_{0.78}Gd_{0.17}Ce_{0.05})_{0.50}Al_5O_{8.25}$ composition corresponds to almost 12-fold surplus of $Al_2O_3$.

All the specimens obtained by the authors were tested in solid sources of white light based on blue-emission light diodes. The results of these tests confirmed the possibility of their practical application in light engineering devices characterised by colour temperature from 2,500 to 15,000 K.

The proven possibility of synthesising luminescent materials of the new kind, containing a considerable surplus of aluminium in relation to oxides of yttrium and rare-earth metals has an enormous practical value because it permits reducing the content of expensive elements in the material by 3 to 5 times and, consequently, considerably reducing the cost of luminescent materials. In other words, this makes them completely affordable in a wide range of applications, not only in the traditional point sources of white light but also in designing new light engineering devices.

The invention claimed is:
1. A luminescent material having the formula:

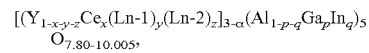

wherein α is a value in the range of 0.20≤α≤2.80
wherein x is the atomic fraction of cerium in the range of 0.001<x<0.15;

wherein $(Ln-1)_y$ is defined as one or more of Gd, Tb, La, Lu and Sm;

wherein $0<y<0.90$;

wherein $(Ln-2)_z$ is defined as one or more of Pr, Nd, Eu, Dy, Ho, Tm, Er and Yb, which are dopants introduced into a cation sub-lattice in the range of $0.0001<z<0.01$;

wherein x, y and z are present such that $1-x-y-z>0$;

wherein p and q include atomic fractions of gallium and indium in an aluminium sub-lattice, wherein $0<p<0.3$ and $0<q<0.3$.

2. The luminescent material according to claim 1, wherein the material is a two-phase system, wherein one phase is aluminium oxide.

3. A luminescent material having the formula:

$$[(Y_{1-x-y-z}Ce_x(Ln-1)_y(Ln-2)_z]_{3-\alpha}Al_5O_{7.80-10.005};$$

wherein $\alpha$ is a value in the range of $0.20 \leq \alpha \leq 2.80$;

wherein x is the atomic fraction of cerium in the range of $0.001<x<0.15$;

wherein $(Ln-1)_y$ is defined as one or more of Gd, Tb, La, Lu and Sm;

wherein $0<y<0.90$;

wherein $(Ln-2)_z$ is defined as one of Pr, Nd, Eu, Dy, Ho, Tm, Er and Yb, which are dopants introduced into a cation sub-lattice in the range of $0.0001<z<0.01$;

wherein x, y and z are present such that $1-x-y-z>0$.

4. The luminescent material as in claim 3, wherein the material is a two-phase system, wherein one phase is aluminium oxide.

5. A luminescent material having the formula:

$$[(Y_{1-x-y}Ce_x(Ln-1)_y]_{3-\alpha}Al_5O_{7.80-10.005};$$

wherein $\alpha$ is a value in the range of $0.20 \leq \alpha \leq 2.80$;

wherein x is the atomic fraction of cerium in the range of $0.001<x<0.15$;

wherein $(Ln-1)_y$ is defined as one or more of Gd, Tb, La, Lu and Sm;

wherein $0<y<0.90$;

wherein $1-x-y>0$.

6. The luminescent material according to claim 5, wherein the material is a two-phase system, wherein one phase is aluminium oxide.

\* \* \* \* \*